(12) United States Patent
Van Dam et al.

(10) Patent No.: US 8,016,399 B2
(45) Date of Patent: Sep. 13, 2011

(54) PRINTING MACHINE

(75) Inventors: Dirkjan Bernhard Van Dam, Eindhoven (NL); Adrianus Cornelius Van Kasteren, Eindhoven (NL); Richard Joseph Marinus Schroeders, Eindhoven (NL)

(73) Assignee: Chimei Innolux Corporation, Miao-Li County (TW)

( * ) Notice: Subject to any disclaimer, the term of this patent is extended or adjusted under 35 U.S.C. 154(b) by 1330 days.

(21) Appl. No.: 10/599,565

(22) PCT Filed: Mar. 29, 2005

(86) PCT No.: PCT/IB2005/051057
§ 371 (c)(1),
(2), (4) Date: Oct. 2, 2006

(87) PCT Pub. No.: WO2005/098993
PCT Pub. Date: Oct. 20, 2005

(65) Prior Publication Data
US 2007/0216914 A1 Sep. 20, 2007

(30) Foreign Application Priority Data
Apr. 5, 2004 (EP) .................................... 04101402

(51) Int. Cl.
*B41J 2/175* (2006.01)
(52) U.S. Cl. .................................. 347/86; 347/5; 347/9
(58) Field of Classification Search .................. 347/5, 9, 347/86, 87, 102, 12, 85
See application file for complete search history.

(56) References Cited

U.S. PATENT DOCUMENTS

| | | | | |
|---|---|---|---|---|
| 6,151,051 A * | 11/2000 | Ikeda et al. | ..................... | 347/86 |
| 6,390,618 B1 * | 5/2002 | Wotton et al. | ................. | 347/102 |
| 2002/0041302 A1 | 4/2002 | Okada et al. | | |
| 2002/0186287 A1 | 12/2002 | Kawase | | |
| 2003/0008429 A1 | 1/2003 | Yamazaki et al. | | |
| 2003/0030715 A1 | 2/2003 | Cheng et al. | | |
| 2003/0099774 A1 | 5/2003 | Morii et al. | | |
| 2003/0140982 A1 | 7/2003 | Seki et al. | | |

FOREIGN PATENT DOCUMENTS

| | | |
|---|---|---|
| EP | 1209744 | 5/2002 |
| JP | 1356857 A | 1/1987 |
| JP | 2002122727 | 4/2002 |
| JP | 2003212685 A | 7/2003 |
| JP | 2003245582 A | 9/2003 |

* cited by examiner

*Primary Examiner* — Lam S Nguyen
(74) *Attorney, Agent, or Firm* — Morris Manning Martin LLP; Tim Tingkang Xia, Esq.

(57) ABSTRACT

A machine (1) is equipped for printing a pattern on a substrate (20). The machine (1) comprises a table (10) for supporting and moving the substrate (20), and a print head (30) for firing ink droplets towards the substrate (20). Further, the machine (1) comprises a cover plate (40) which is arranged such as to encompass the print head (30), wherein the print head (30) partly extends through a hole in the cover plate (40). During a printing process, evaporation of solvent which is part of the ink droplets starts as soon as the ink droplets land on the substrate (20). The presence of the cover plate (40) has an equalizing effect on the evaporation rate over the printed pattern. As a result, a height distribution of all printed elements of the pattern is within predetermined limits, once the elements have dried up.

5 Claims, 4 Drawing Sheets

PRINTING MACHINE

Figure 1:
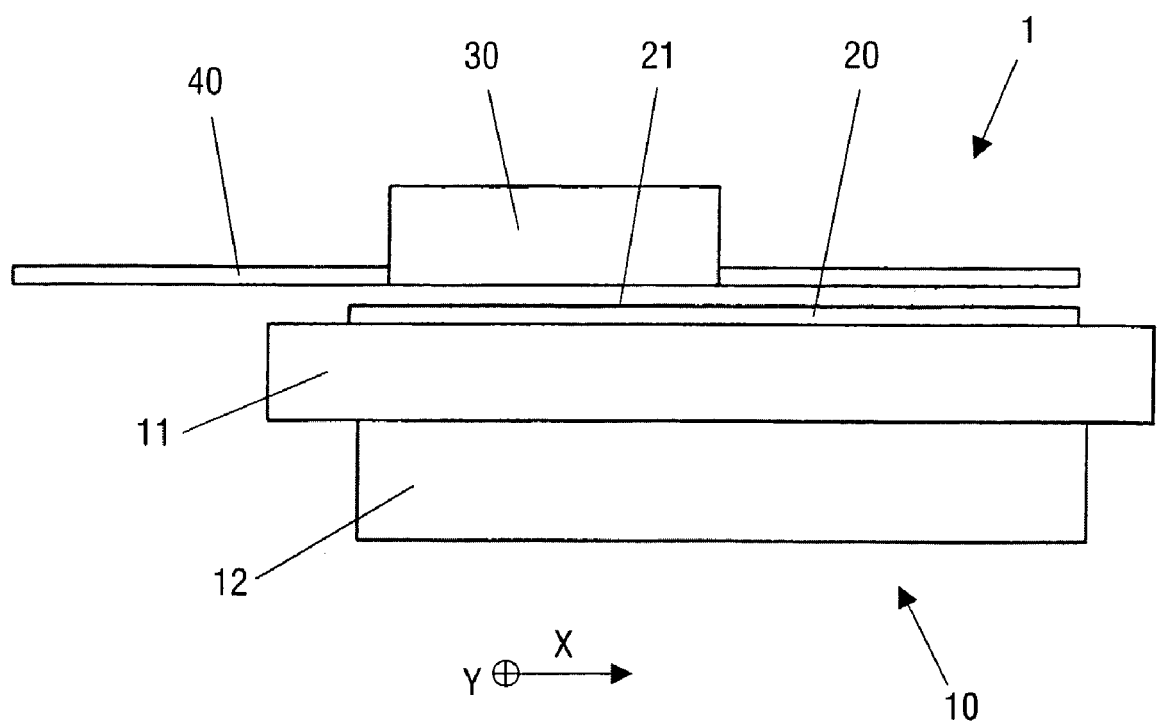

The present invention relates to a method for providing a substrate with a printed pattern, wherein the pattern is applied by means of an ink-jet printing process during which a print head for firing ink droplets towards the substrate is used, and during which the print head and the substrate are moved with respect to each other.

In general, ink-jet printing processes involve laying down a layer of ink on a substrate by means of a print head comprising a number of nozzles for releasing ink droplets. In order to obtain a pattern, the print head and the substrate are moved with respect to each other, while the nozzles are activated to intermittently fire ink droplets towards the substrate. The appearance of the obtained pattern on the substrate is determined by the characteristics of the output of the print head on the one hand, and by the adopted positions of the substrate and the print head with respect to each other on the other hand.

In the following, for the sake of simplicity, it is assumed that during the printing process, the substrate is moved, while the position of the print head is fixed. That does not alter the fact that the present invention is also applicable for the purpose of processes in which a movement of the substrate and the print head is realized in another way, i.e. processes in which only the print head is moved, or in which both the substrate and the print head are moved.

Ink-jet printing proves to be an enabling technology for the manufacturing of displays comprising a large number of light emitting diodes, which displays are commonly referred to as PolyLED displays. In general, PolyLED displays comprise a substrate and a number of light emitting diodes, wherein the light emitting diodes are positioned on the substrate according to a predetermined pattern. Each light emitting diode (commonly referred to as LED) comprises electrodes and a printed element. The printed element comprises a stack of individual layers, wherein each layer is formed by laying down the material of the layer dissolved in a solvent on a substrate portion having a predetermined shape and predetermined dimensions. It will be understood that the ink droplets which are released by the print head for the purpose of providing the substrate with the layers comprise the said solvent and the said material of the layers.

The present invention is applicable both in case of components of the printed pattern comprising one printed layer and in case of components of the printed pattern comprising more than one printed layer.

In many cases, for the purpose of manufacturing PolyLED displays, the dimensions of the desired pattern are larger than the dimensions of the print head in a direction perpendicular to the direction in which the substrate is moved during the ink-jet printing process. Therefore, in such cases, the movement of the substrate is performed in two or more strokes, wherein in each stroke, the position of the substrate with respect to the print head is fixed in the direction perpendicular to the direction in which the substrate is moved.

In practice, during the manufacturing process of PolyLED displays, it appears that the printed elements of LEDs which are located at an edge portion of the pattern which is printed in one stroke, i.e. LEDs which are located at a periphery of said pattern, are in many cases substantially different from the printed elements of other LEDs, in particular LEDs which are located at a centre portion of the pattern. The difference pertains to a height distribution of the printed elements, and becomes apparent once the solvent has evaporated, in other words, once the elements have completely dried up. Consequently, in case the entire pattern of printed elements has been obtained in two or more strokes, mutually different bands may be discerned, wherein the height distribution properties of the printed elements of one band differ substantially from the height distribution properties of an adjacent band, as the printed elements of the one band have been located at an edge portion of a pattern which is printed in one stroke, and the printed elements of the adjacent band have been located more at a centre portion of the pattern. The height distribution of each printed element has to be within predetermined limits, as the appearance and the operation of the LEDs are related to this property. However, the height distribution differences may be so large that the height distribution of a portion of the printed elements is outside of the limits, as a consequence of which the LEDs associated with said portion of printed elements cannot be used in practice.

For the sake of clarity, it is remarked that the used term "height" should be understood such as to indicate a distance between a top surface of the printed element and a bottom surface of the printed element, wherein it is assumed that the bottom surface of the printed element rests on the substrate. Different portions of the printed element have different heights, so that the top surface of the printed element is not completely planar, but has an uneven appearance. Therefore, the "height distribution" of a printed element pertains to the different heights of the printed element, as determined in directions perpendicular to a direction in which the height is determined. In order for a LED to function properly, the height distribution of its printed element should be between predetermined limits, in other words, the top surface of its printed element should completely fit between an imaginary under limit surface and an imaginary upper limit surface.

It is an important objective of the present invention to adjust the known method for printing PolyLED displays in such a way that the number of printed elements having a height distribution which is unacceptable, in other words, the number of LEDs which can not be used in practice, is reduced, preferably to zero. The objective is achieved by means of a printing method which comprises the step of diminishing a difference between an evaporation rate of an edge portion of the printed pattern and an evaporation rate of a centre portion of the printed pattern by conditioning the vicinity of at least a portion of the printed pattern.

According to an important insight underlying the present invention, the differences in the height distribution of the printed elements are obtained as a result of differences in an evaporation rate of the applied solvent during the printing process. In general, an edge dot printed at an edge portion of a pattern dries quicker than a centre dot printed at a centre portion of the pattern, as a humidity level of the vicinity of the edge dot is lower than the humidity level of the vicinity of the centre dot. By conditioning the vicinity of at least a portion of the printed pattern, for example the vicinity of one of the edge portion and the centre portion, or the vicinity of both portions, the differences in the evaporation rate are diminished, so that a more uniform height distribution of the printed elements may be obtained.

The present invention offers two important manners of diminishing the evaporation rate differences.

According to the first manner, a cover plate is applied, which is positioned above the printed pattern and/or alongside the printed pattern. In this way, at least a portion of the vicinity of the printed pattern is covered. Preferably, the cover plate is arranged such as to encompass the print head, and a value of a distance between the cover plate and the substrate is chosen such as to be relatively small. It will be understood that in general, the presence of the cover plate has a decelerating effect on the evaporation process of the solvent, as the escape of solvent vapour is hindered by the cover plate. As a result, a drying process of the printed pattern takes place in a more uniform manner, wherein the differences in the height distribution of the printed elements are diminished to an acceptable level.

According to the second manner, solvent vapour is supplied to a freshly printed pattern, at one side of the pattern, and solvent vapour is extracted at another side of the pattern, so that it is ensured that the entirety of the printed pattern is continually surrounded by vapour, due to the fact that it is continually in contact with a vapour flow. Like the above-described application of the cover plate, keeping the printed pattern in a vapour environment during the drying process leads to a more uniform proceeding of the drying process, and thereby to a reduction of the differences between the height distributions of the printed elements.

The present invention also relates to a printing machine which is designed for carrying out the method according to the present invention, i.e. a printing machine which is equipped for conditioning the vicinity of at least a portion of a pattern which has been printed on a substrate, in order to diminish a difference between an evaporation rate of an edge portion of the printed pattern and an evaporation rate of a centre portion of the printed pattern.

Figure 2:
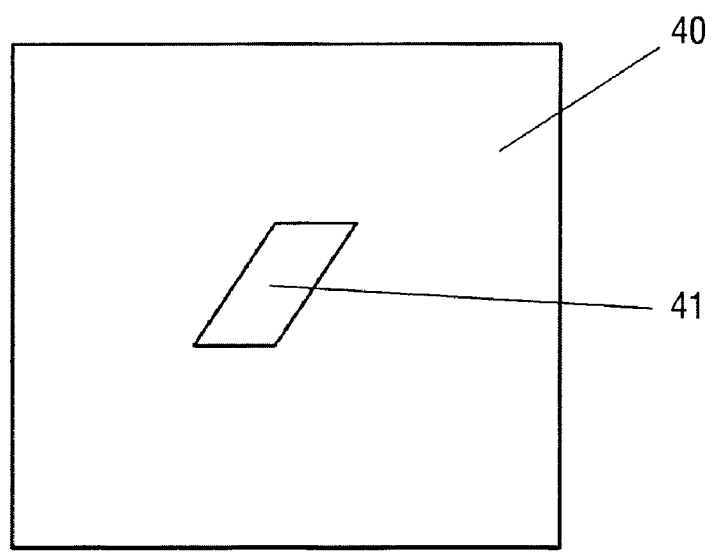
Figure 3:
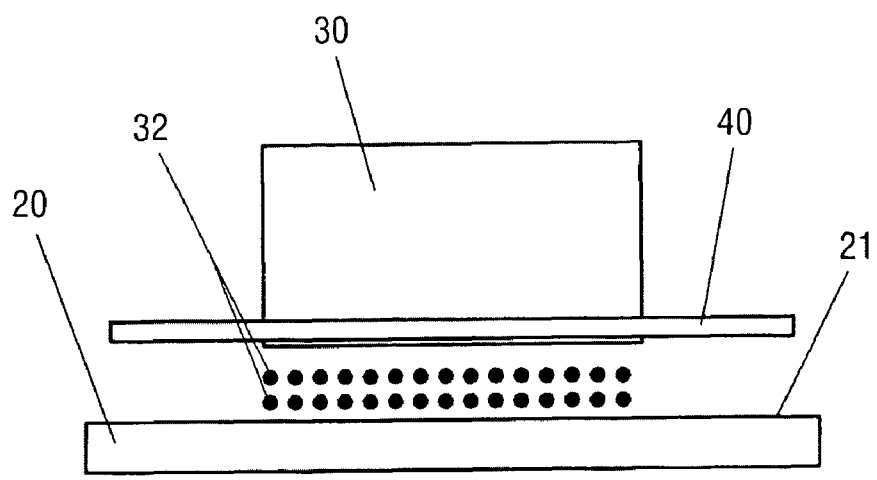
Figure 4:
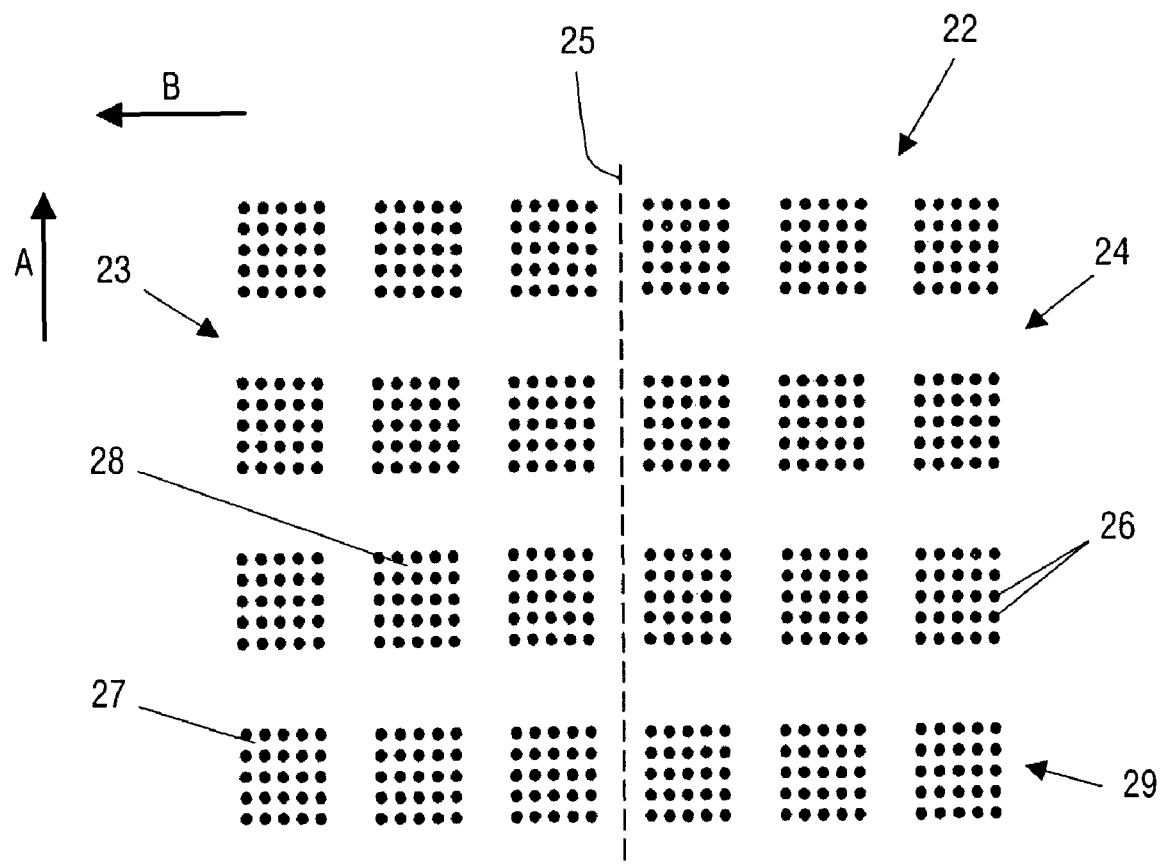
Figure 5:
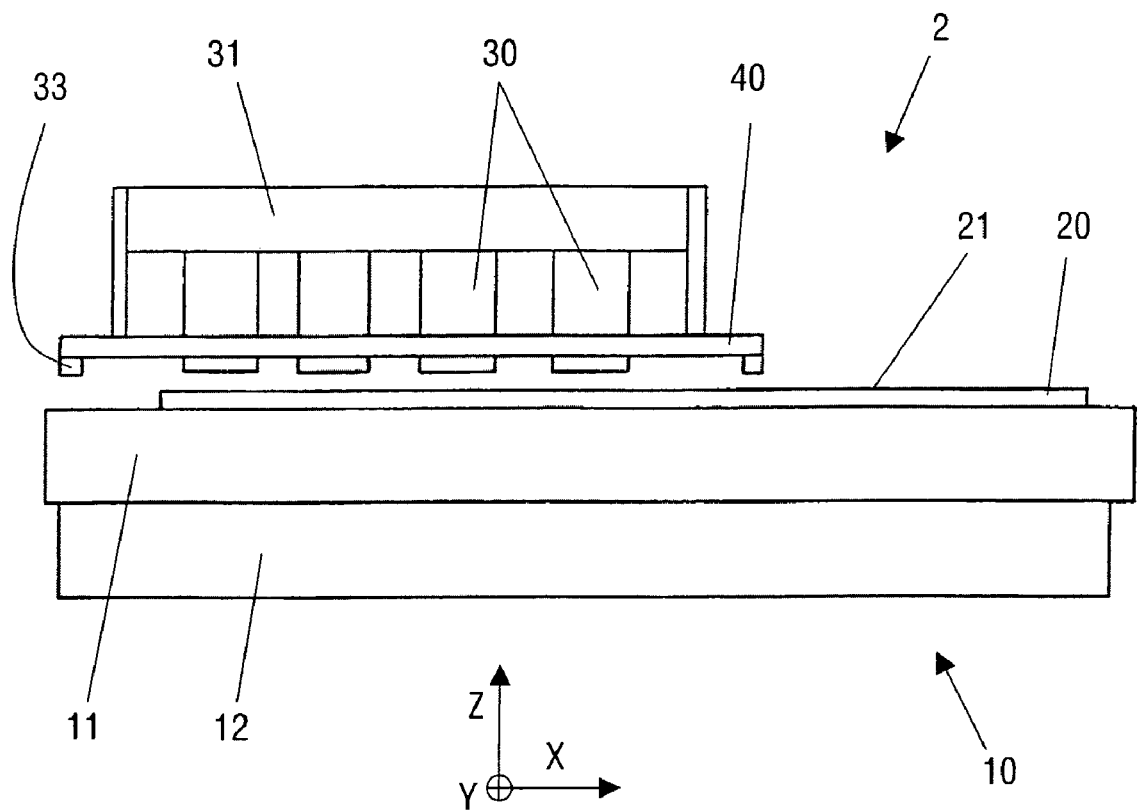
Figure 6:
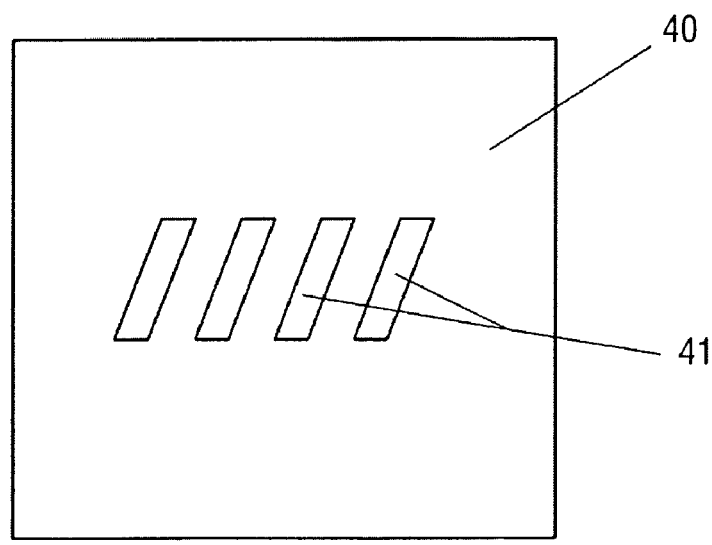
Figure 7:
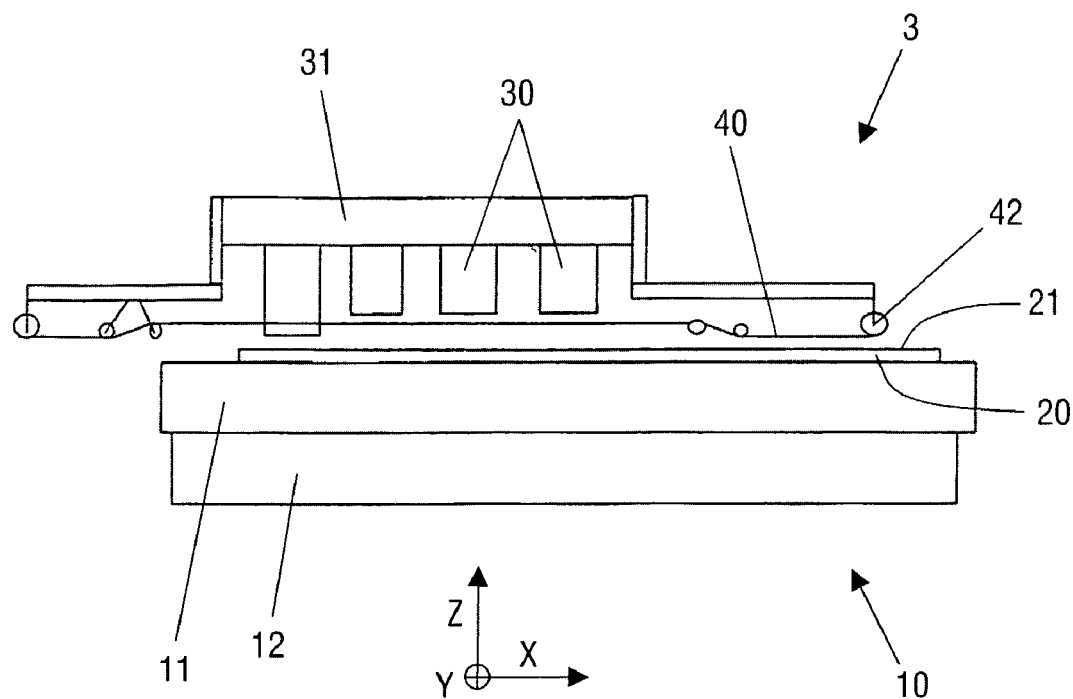
Figure 8:
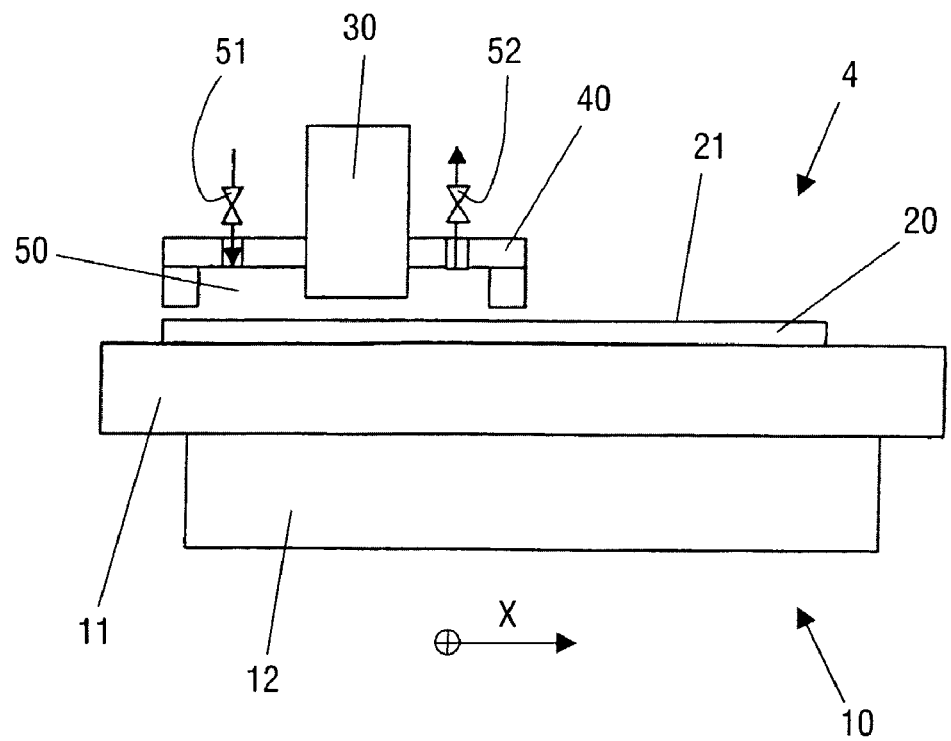

The present invention will now be explained in greater detail with reference to the figures, in which similar parts are indicated by the same reference signs, and in which:

FIG. 1 diagrammatically shows a printing machine according to a first preferred embodiment of the present invention, as well as a substrate which is positioned in the printing machine;

FIG. 2 diagrammatically shows a top view of a cover plate of the printing machine as shown in FIG. 1;

FIG. 3 diagrammatically shows a print head and the cover plate of the printing machine as shown in FIG. 1, the substrate, and ink droplets released by the print head;

FIG. 4 diagrammatically shows an obtained pattern on the substrate;

FIG. 5. diagrammatically shows a printing machine according to a second preferred embodiment of the present invention, as well as a substrate which is positioned in the printing machine;

FIG. 6 diagrammatically shows a top view of a cover plate of the printing machine as shown in FIG. 5;

FIG. 7 diagrammatically shows a printing machine according to a third preferred embodiment of the present invention, as well as a substrate which is positioned in the printing machine; and FIG. 8 diagrammatically shows a printing machine according to a fourth preferred embodiment of the present invention, as well as a substrate which is positioned in the printing machine.

In FIG. 1, a printing machine 1 according to a first preferred embodiment of the present invention is diagrammatically shown. This first printing machine 1 comprises a movable table 10 for supporting and moving a substrate 20, and a print head 30 for firing ink droplets towards the substrate 20. The print head 30 is provided with a number of nozzles (not shown), which may for example be arranged in a row, wherein each nozzle is capable of releasing individual ink droplets. The substrate 20 comprises a receiving surface 21 for receiving the ink droplets. In the first printing machine 1, the print head 30 is positioned above the receiving surface 21. For the sake of simplicity, a frame of the first printing machine 1 for accommodating the various parts of the printing machine 1 is not shown in FIG. 1.

The table 10 comprises an X-table 11 and a Y-table 12. The X-table 11 is movable in an X-direction and the Y-table 12 is movable in a Y-direction, wherein the X-direction and the Y-direction correspond to directions in a plane in which the receiving surface 21 of the substrate 20 extends, and wherein the X-direction and the Y-direction are perpendicular with respect to each other. Both the X-direction and the Y-direction are indicated in FIG. 1.

During operation of the first printing machine 1, the table 10 is moved, wherein the substrate 20 is placed at predetermined printing positions with respect to the print head 30. Each time the substrate 20 has assumed a printing position with respect to the print head 30, the print head 30 is activated to release ink droplets. In this way, a printed pattern is formed on the receiving surface 21 of the substrate 20. An example of a printed pattern is shown in FIG. 4, and is indicated by reference numeral 22.

In general, the ink droplets comprise print material dissolved in a solvent. As soon as an ink droplet has landed on the receiving surface 21 of the substrate 20, a drying process starts, during which the solvent evaporates, while the print material remains on the receiving surface 21. The ink droplet has completely dried up when all solvent has evaporated.

The first printing machine 1 may be applied for the purpose of printing elements of LEDs on the substrate 20, which is an important step in a manufacturing process of a PolyLED display. In such a case, the receiving surface 21 of the substrate 20 is provided with electrodes (not shown). Normally, the printed elements of the LEDs comprise a number of layers, wherein each layer is obtained by dosing ink droplets at the position of a substrate portion having a predetermined shape and a predetermined size, and wherein the ink droplets comprise material of the layer dissolved in a solvent. In printing two successive layers, a subsequent layer may be printed when a preceding layer has dried up, i.e. once all solvent of the preceding layer has evaporated.

In respect of printing LED elements in order to manufacture a PolyLED display, it appears that an obtained height distribution of the printed elements is influenced by an evaporation rate of the evaporation process of the solvent. In order to realize that the differences in height distribution of the printed elements remain between acceptable limits, the first printing machine 1 comprises a cover plate 40 for covering a portion of the receiving surface 21 of the substrate 20, wherein a distance between the cover plate 40 and the substrate 20 is relatively small. A top view of the cover plate 40 is shown in FIG. 2.

In the shown example, the cover plate 40 is arranged such as to encompass the print head 30, and therefore comprises a hole 41 for letting through the print head 30. Further, in the shown example, the dimensions of the cover plate 40 are chosen such that the receiving surface 21 of the substrate 20 is completely covered by the entirety of the print head 30 and the surrounding cover plate 40, in every possible position of the table 10. Preferably, the cover plate 40 is attached to the print head 30, but that does not alter the fact that the cover plate 40 may for example also be attached to the frame of the first printing machine 1.

In the shown example, the dimensions of the print head 30 in both the X-direction and the Y-direction are smaller than the dimensions of the receiving surface 21 of the substrate 20 in said directions. In order to cover a substantial portion of the substrate 20 with a printed pattern 22, the movement of the substrate 20 with respect to the print head 30 needs to take place in several strokes.

Normally, during each stroke of a printing process in which at least two strokes are performed, only one of the X-table 11 and the Y-table 12 is moved, while the print head 30 intermittently fires ink droplets towards the receiving surface 21 of the substrate 20. In the process, another one of the X-table 11 and the Y-table 12 is only moved when one stroke of the printing process has finished and another stroke needs to be started. Assuming that a pattern portion associated with a subsequent stroke is to be laid down adjacent to a pattern portion associated with a preceding stroke, a distance which is covered while shifting strokes substantially corresponds to a width of the pattern portion.

FIG. 3 diagrammatically shows the print head 30 and the surrounding cover plate 40, as well as ink droplets 32 released by the print head 30, and the substrate 20.

FIG. 4 shows an example of a printed pattern 22 which has been laid down in two strokes on the receiving surface 21 of the substrate 20. In the figure, a pattern portion which has been obtained first is indicated by reference numeral 23, whereas a pattern portion which has been obtained last is indicated by reference numeral 24. An imaginary borderline between the first pattern portion 23 and the last pattern portion 24 is diagrammatically depicted by means of a dashed line 25. Furthermore, a direction of movement of the table 10 associated with one stroke is indicated by means of an arrow A, whereas a direction of movement of the table 10 associated with a shift of strokes is indicated by means of an arrow B.

The printed pattern 22 as shown in FIG. 4 comprises elements 29, which are formed on the basis of printed dots 26, wherein each printed dot 26 represents an ink droplet 32 which has landed on the receiving surface 21 of the substrate 20. In the example as shown in FIG. 4, each element 29 comprises 5×5 dots 26. The shown elements 29 may be part of LEDs of a PolyLED display. In that case, in actual practice, it is not possible to distinguish separate dots 26 of the elements 29. Instead, the elements 29 have a continuous appearance. FIG. 4 only serves to illustrate the present invention, wherein it is not intended to provide a realistic picture of the actual appearance of printed elements of LEDs.

During the printing process, as soon as an ink droplet 32 lands on the receiving surface 21 of the substrate 20, evaporation of the solvent contained by the ink droplet 32 starts. An important factor influencing an evaporation rate at which the evaporation process of the solvent takes place, is a condition of a vicinity of the dot 26 which is obtained on the basis of the ink droplet 32. Especially in a situation in which no cover plate 40 is applied, the condition of the vicinity of a dot 26 printed at an edge portion 27 of a pattern portion 23, 24 differs from the condition of the vicinity of a dot 26 printed at a centre portion 28 of a pattern portion 23, 24. At the edge portion 27 of the pattern portion 23, 24, a humidity level is lower, due to the fact that a dot 26 printed at the centre portion 28 of the pattern 23, 24 is surrounded by more other freshly printed dots 26 than a dot 26 printed at the edge portion 27 of the pattern 23, 24. As a result, an evaporation rate at the edge portion 27 is higher than an evaporation rate at the centre portion 28, wherein the difference between the evaporation rates may be so large that it is not possible for all printed elements 29 to obtain a height distribution which is within acceptable limits. In many cases, it appears that the obtained height distribution of an element 29 printed at the edge portion 27 of a pattern portion 23, 24 is more uneven than the obtained height distribution of an element 29 printed at the centre portion 28 of a pattern portion 23, 24, such that the height distribution of the first element 29 does not meet the requirements.

The application of the cover plate 40 leads to a reduction of the differences in the evaporation rate over the pattern portions 23, 24. It appears to be possible to diminish the differences to such an extent that the obtained height distribution of all printed elements 29 is within predetermined limits. Therefore, when the cover plate 40 is applied during a process of printing elements 29 of LEDs of a PolyLED display, it can be ensured that the height distribution of the printed elements 29 of all LEDs is within predetermined limits, so that all LEDs are usable.

It will be understood that within the scope of the present invention, the cover plate 40 may be designed in various ways. For example, it is not essential that the cover plate 40 is shaped such as to completely encompass the print head 30. Furthermore, it is not essential that the dimensions of the cover plate 40 are chosen such that the receiving surface 21 of the substrate 20 is completely covered by the entirety of the print head 30 and the surrounding cover plate 40, in every possible position of the table 10. The cover plate 40 may comprise a number of separate portions, for example two portions which are arranged at opposite sides of the print head 30.

The cover plate 40 may be provided with holes for letting through solvent vapour at predetermined places, wherein the holes do not need to be identical. Instead, the dimensions and/or shape of one hole may deviate from the dimensions and/or shape of another hole. It is also possible that at least a portion of the cover plate 40 is designed as a porous membrane or as a kind of wire gauze, wherein the extent to which the cover plate 40 is permeable to vapour may be different for different portions of the cover plate 40.

The cover plate 40 may be movably arranged, for example in the X-direction and in the Y-direction, especially in case of a printing machine comprising a movably arranged print head 30 and a fixedly arranged table 10.

In FIG. 5, a printing machine 2 according to a second preferred embodiment of the present invention is diagrammatically shown. Like the first printing machine 1, the second printing machine 2 comprises a movable table 10 having an X-table 11 and a Y-table 12, which table 10 serves for supporting a substrate 20. For the sake of simplicity, a frame of the second printing machine 2 for accommodating the table 10 and other parts of the printing machine 2 is not shown in FIG. 5.

The second printing machine 2 is equipped for printing layers of different colours on the substrate 20. Therefore, the second printing machine 2 comprises more than one print head 30. In FIG. 5, a print head unit 31 comprising four print heads 30 is shown as an example. The print heads 30 are movably arranged in a Z-direction, i.e. a direction perpendicular to both the X-direction and the Y-direction. The Z-direction is indicated in FIG. 5, as well as the X-direction and the Y-direction. The print head unit 31 is also movably arranged, in a direction in which the print heads 30 are adjacent to each other, which direction corresponds to the X-direction in the shown example. In this way, during a printing process, when the substrate 20 has been put at a predetermined printing position with respect to the print head unit 31 by means of the table 10, it is possible to successively print layers on a predetermined portion of the substrate 20, using the four separate print heads 30. Preferably, the print head unit 31 is capable of assuming four different positions, in order to be capable of putting each of the four print heads 30 at a predetermined position with respect to the receiving surface 21 of the substrate 20.

Like the first printing machine 1, the second printing machine 2 comprises a cover plate 40. A top view of the cover plate 40 is shown in FIG. 6. In both the X-direction and the Y-direction, the dimensions of the cover plate 40 of the second printing machine 2 are larger than those of the print head unit 31. For the purpose of letting through the four print heads 30, the cover plate 40 is provided with four holes 41. During a printing process, the print heads 30 may be activated one at a time. In such a situation, an activated print head 30 is positioned such as to partly extend through the associated hole 41 in the cover plate 40, while the other print heads 30 are positioned above the cover plate 40.

In the second printing machine 2, the application of the cover plate 40 also has the effect of conditioning the vicinity of a pattern 22 which has been freshly printed on the receiving surface 21 of the substrate 20. Hereby, differences in a drying rate of the various elements 29 of the pattern 22 are diminished, as a result of which differences in an obtained height distribution of the elements 29 are diminished, so that the obtained height distribution of all elements 29 is within acceptable limits.

Preferably, as shown in FIG. 5, a raised edge 33 is provided at the circumference of the cover plate 40, at a side of the cover plate 40 facing the table 10, in order to increase the covering ability of the cover plate 40 at the circumference of the cover plate 40.

The four print heads 30 of the second printing machine 2 may also be used to print one layer of one colour. In such case, during a printing process, all print heads 30 are activated simultaneously, wherein all print heads 30 partly extend through the holes 41. In this way, the time needed for the printing process is shortened with respect to a printing process in which only one print head 30 is applied.

In FIG. 7, a printing machine 3 according to a third preferred embodiment of the present invention is diagrammatically shown. Like the second printing machine 2, the third printing machine 3 comprises a movable table 10 having an X-table 11 and a Y-table 12, which table 10 serves for supporting a substrate 20, and a movably arranged print head unit 31 having four movably arranged print heads 30. The X-direction, the Y-direction and the Z-direction are indicated in FIG. 7. For the sake of simplicity, a frame of the third printing machine 3 for accommodating the parts of the printing machine 3 is not shown in FIG. 7.

Besides the table 10 and the print head unit 31, the third printing machine 3 comprises a rollable cover sheet 40, comprising one hole 41 (like the cover plate 40 of the first printing machine 1) for letting through a print head 30. Opposite sides of the cover sheet 40 are rolled about two rollers 42, which are arranged at opposite sides of the print head unit 31. A direction in which the cover sheet 40 is rollable corresponds to a direction in which the print heads 30 are adjacent to each other, i.e. the X-direction in the shown example.

During a printing process, a position of the cover sheet 40 with respect to the print head unit 31 is varied, depending on the activation of the print heads 30, such that an activated print head 30 extends through the hole 41 in the cover sheet 40, while the other print heads are positioned above the cover sheet 40. For example, when a pattern 22 has been printed on the receiving surface 21 of the substrate 20 by means of a first print head 30, and a second print head 30 needs to be subsequently used to print a pattern 22 on the receiving surface 21, the following successive steps are taken: 1) the first print head 30 is moved in a direction away from the receiving surface 21, until it has reached a position above the cover sheet 40; 2) the rollers 42 are rotated in one rotational direction in order to displace the cover sheet 40 with respect to the print head unit 31, until the hole 41 in the cover sheet 40 is positioned such that it is capable of letting through the second print head 30; and 3) the second print head 30 is moved in a direction towards the receiving surface 21, wherein part of the second print head 30 moves through the hole 41 in the cover sheet 40.

During a printing process which is performed by the second printing machine 2, the condition of the vicinity of a freshly printed pattern 22 is influenced by the presence of the holes 41 in the cover plate 40 positioned below inactive print heads 30. It will be clear that such an effect does not occur when the third printing machine 3 is applied, as the cover sheet 40 of the third printing machine 3 only comprises one hole 41 for letting through a print head 30.

It will be understood that in order to realize a displacement of the cover sheet 40 with respect to the print head unit 31 and/or the substrate 20, it is not necessary that the cover sheet 40 is rollable, and is rolled about two rollers 42 positioned at opposite sides of the cover sheet 40, as other suitable ways for displacing the cover sheet 40 are available.

In general, according to the present invention, the presence of a cover plate or sheet 40 in the vicinity of a printed pattern 22, above and/or alongside of the pattern 22, has an equalizing effect on the evaporation rate of the solvent over the printed pattern 22. As a result, a height distribution of all printed elements 29 of the pattern 22 is within predetermined limits, once the elements 29 have dried up.

In FIG. 8, a printing machine 4 according to a fourth preferred embodiment of the present invention is diagrammatically shown. Like the first printing machine 1, the fourth printing machine 4 comprises a movable table 10 having an X-table 11 and a Y-table 12, which table 10 serves for supporting a substrate 20, a print head 30, and a cover plate 40 encompassing the print head 30. Both the X-direction and the Y-direction are indicated in FIG. 8. For the sake of simplicity, a frame of the fourth printing machine 4 for accommodating the parts of the printing machine 4 is not shown in FIG. 8.

The fourth printing machine 4 comprises supplying means 51 for supplying solvent vapour to a vapour space 50 which is present between the cover plate 40 and the receiving surface 21 of the substrate 20. Furthermore, the fourth printing machine 4 comprises extracting means 52 for extracting solvent vapour from the vapour space 50. The supplying means 51 and the extracting means 52 are arranged at different positions, so that a flow of solvent vapour is realized in the vapour space 50, and a steady vapour state is obtained. In this way, it is ensured that a freshly printed pattern 22 is always positioned in a vapour environment.

According to the present invention, allowing a printed pattern 22 to dry in a vapour environment leads to a reduction of the differences in the evaporation rate over the pattern 22. Consequently, when the vapour environment is created during a process of printing elements 29 of LEDs of a PolyLED display, it can be ensured that the height distribution of the printed elements 29 of all LEDs is within predetermined limits, so that all LEDs are usable.

It will be clear to a person skilled in the art that the scope of the present invention is not limited to the examples discussed in the foregoing, but that several amendments and modifications thereof are possible without deviating from the scope of the present invention as defined in the attached claims.

In particular, it will be clear that it is not necessary that the printed pattern 22 and/or a surrounding portion of the receiving surface 21 of the substrate 20 are entirely covered by a cover plate or sheet 40, or that the entire printed pattern 22 is placed in a vapour environment. In case of a drying process of only a portion of the pattern 22 being influenced by such measures, it is not possible to obtain optimal printing results, but still there will be less printed elements 29 having a height distribution which is outside of the acceptable limits than in case of such measures not being applied at all.

The present invention is relevant in situations in which the height distribution of the various elements 29 of printed patterns 22 needs to be within predetermined limits. This is the case in a context of PolyLED displays comprising printed LEDs having printed elements 29, as has already been described in the foregoing. However, this is also the case in other contexts, for example a context of liquid crystal displays comprising printed transistors.

Although it is practical, it is not necessary that a cover plate or sheet 40 is already present during the printing process of a pattern 22 in view of diminishing the differences in the evaporation rate of the various portions of the pattern 22. The diminishing effect is also obtained in case of the cover plate or sheet 40 being positioned above and/or alongside a pattern 22 right after the pattern 22 has been printed.

The fact that the possibility of placing the printed pattern 22 in a vapour environment has been described in the context of a printing machine 4 having only one print head 30 does not imply that the vapour environment cannot be created in a printing machine having more than one print head 30. For example, the shown second printing machine 2 and third printing machine 3 may also be provided with supplying means 51 and extracting means 52 for obtaining a steady vapour state.

Within the scope of the present invention, it is also possible to only apply supplying means 51 for supplying solvent vapour to the vicinity of the printed pattern 22, or to only apply extracting means 52 for extracting solvent vapour from the vicinity of the printed pattern 22. In such a case, it is important that the positions of the supplying means 51 or the extracting means 52 are chosen such that these means 51, 52 are capable of diminishing differences in a humidity level over the pattern 22.

The invention claimed is:

1. Printing machine, comprising:
   at least one print head (30) for releasing ink droplets (32);
   a table (10) for supporting a substrate (20) having a receiving surface (21) for receiving ink droplets (32) from the at least one print head (30);
   moving means for moving the at least one print head (30) and the table (10) with respect to each other; and
   covering means (40) for covering at least a portion of the table (10), which are provided with at least one hole (41) for letting through the at least one print head (30),
   wherein the number of holes (41) in the covering means (40) for letting through the print heads (30) is smaller than the number of print heads (30);
   wherein the covering means (40) and the print heads (30) are movably arranged with respect to each other;
   wherein the covering means comprise a rollable sheet (40); and
   wherein rotatably arranged rollers (42) are provided for reeling two opposite sides of the sheet (40).

2. Printing machine according to claim 1, wherein the covering means (40) are arranged such as to encompass the at least one print head (30).

3. Printing machine according to claim 1, wherein the covering means (40) are attached to the at least one print head (30).

4. Printing machine according to claim 1, comprising supplying means (51) for supplying vapour to a space (50) which is present between the covering means (40) and the table (10).

5. Printing machine according to claim 1, comprising extracting means (52) for extracting vapour from a space (50) which is present between the covering means (40) and the table (10).

* * * * *